United States Patent
Lee et al.

(10) Patent No.: US 8,771,791 B2
(45) Date of Patent: Jul. 8, 2014

(54) DEPOSITION OF LAYER USING DEPOSITING APPARATUS WITH RECIPROCATING SUSCEPTOR

(75) Inventors: Sang In Lee, Sunnyvale, CA (US); Chang Wan Hwang, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 273 days.

(21) Appl. No.: 13/273,076

(22) Filed: Oct. 13, 2011

(65) Prior Publication Data

US 2012/0094149 A1 Apr. 19, 2012

Related U.S. Application Data

(60) Provisional application No. 61/394,275, filed on Oct. 18, 2010.

(51) Int. Cl.
*C23C 16/00* (2006.01)
*C23C 16/40* (2006.01)

(52) U.S. Cl.
USPC ............... 427/255.5; 427/255.31; 427/376.2

(58) Field of Classification Search
USPC ............... 427/255.31, 255.5, 376.2; 117/98
See application file for complete search history.

(56) References Cited

U.S. PATENT DOCUMENTS

| | | |
|---|---|---|
| 3,896,244 A | 7/1975 | Ellis et al. |
| 4,891,247 A | 1/1990 | Shamshoian |
| 5,120,568 A | 6/1992 | Schuurmans et al. |
| 5,286,295 A | 2/1994 | Sauvinet et al. |
| 5,300,189 A | 4/1994 | Kokaku et al. |
| 5,368,897 A | 11/1994 | Kurihara et al. |
| 5,549,780 A | 8/1996 | Koinuma et al. |
| 5,560,777 A | 10/1996 | Ahn |
| 5,565,249 A | 10/1996 | Kurihara et al. |
| 5,578,130 A | 11/1996 | Hayashi et al. |
| 5,665,640 A | 9/1997 | Foster et al. |
| 5,711,814 A | 1/1998 | Mori |
| 5,820,947 A | 10/1998 | Itoh |
| 5,863,337 A | 1/1999 | Neuman et al. |
| 5,951,771 A | 9/1999 | Raney et al. |
| 6,051,150 A | 4/2000 | Miyakawa |
| 6,079,353 A | 6/2000 | Leksell et al. |

(Continued)

FOREIGN PATENT DOCUMENTS

| | | |
|---|---|---|
| CN | 1436602 A | 8/2003 |
| EP | 0188208 A2 | 7/1986 |

(Continued)

OTHER PUBLICATIONS

Maydannik, P.S., et al., "An atomic layer deposition process for moving flexible substrates". Chemical Engineering Journal 171 (2011) 345-349.*

(Continued)

*Primary Examiner* — Bret Chen
(74) *Attorney, Agent, or Firm* — Fenwick & West LLP

(57) ABSTRACT

Atomic layer deposition is performed by reciprocating a susceptor in two directions, subjecting a substrate on the susceptor to two different sequences of processes. By subjecting the susceptor to different sequences of processes, the substrate undergoes different processes that otherwise would have required an additional set of injectors or reactors. The reduced number of injectors or reactors enables a more compact deposition device, and reduces the cost associated with the deposition device.

8 Claims, 8 Drawing Sheets

(56) References Cited

U.S. PATENT DOCUMENTS

| | | | |
|---|---|---|---|
| 6,099,974 A | 8/2000 | Lenling | |
| 6,143,077 A | 11/2000 | Ikeda et al. | |
| 6,319,615 B1 | 11/2001 | Jansen | |
| 6,354,109 B1 | 3/2002 | Boire et al. | |
| 6,406,590 B1 | 6/2002 | Ebata et al. | |
| 6,416,822 B1 | 7/2002 | Chiang et al. | |
| 6,424,091 B1 | 7/2002 | Sawada et al. | |
| 6,435,428 B2 | 8/2002 | Kim et al. | |
| 6,521,048 B2 | 2/2003 | Miller et al. | |
| 6,641,673 B2 | 11/2003 | Yang | |
| 6,656,831 B1 | 12/2003 | Lee et al. | |
| 6,730,614 B1 | 5/2004 | Lim et al. | |
| 6,972,055 B2 | 12/2005 | Sferlazzo | |
| 6,997,371 B2 | 2/2006 | Shabtay | |
| 7,886,688 B2 | 2/2011 | Takeuchi et al. | |
| 7,943,527 B2 | 5/2011 | Kumar et al. | |
| 8,257,799 B2 | 9/2012 | Lee | |
| 8,328,982 B1 | 12/2012 | Babayan et al. | |
| 2001/0047759 A1 | 12/2001 | Matsui et al. | |
| 2002/0092616 A1 | 7/2002 | Kim | |
| 2002/0100418 A1* | 8/2002 | Sandhu et al. | 118/719 |
| 2002/0112819 A1 | 8/2002 | Kamarehi et al. | |
| 2002/0197864 A1 | 12/2002 | Sneh | |
| 2003/0072881 A1 | 4/2003 | Yang et al. | |
| 2003/0143328 A1 | 7/2003 | Chen et al. | |
| 2003/0214043 A1 | 11/2003 | Saitoh et al. | |
| 2004/0052972 A1* | 3/2004 | Schmitt | 427/569 |
| 2004/0067641 A1 | 4/2004 | Yudovsky | |
| 2004/0083967 A1 | 5/2004 | Yuda et al. | |
| 2004/0129212 A1 | 7/2004 | Gadgil et al. | |
| 2004/0171280 A1* | 9/2004 | Conley et al. | 438/785 |
| 2004/0224527 A1 | 11/2004 | Sarigiannis et al. | |
| 2004/0247787 A1* | 12/2004 | Mackie et al. | 427/248.1 |
| 2004/0261946 A1 | 12/2004 | Endoh et al. | |
| 2005/0016457 A1 | 1/2005 | Kawasaki et al. | |
| 2005/0064207 A1 | 3/2005 | Senzaki et al. | |
| 2005/0064236 A1 | 3/2005 | Lim et al. | |
| 2005/0106094 A1 | 5/2005 | Kondo | |
| 2005/0183768 A1 | 8/2005 | Roscheisen et al. | |
| 2006/0019033 A1 | 1/2006 | Muthukrishnan et al. | |
| 2006/0068519 A1 | 3/2006 | Dunbar et al. | |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0237399 A1 | 10/2006 | Horner-Richardson et al. | |
| 2006/0240665 A1 | 10/2006 | Kang et al. | |
| 2007/0082500 A1 | 4/2007 | Norman et al. | |
| 2007/0145023 A1 | 6/2007 | Holber et al. | |
| 2007/0224348 A1* | 9/2007 | Dickey et al. | 427/248.1 |
| 2007/0237699 A1 | 10/2007 | Clark | |
| 2007/0243325 A1 | 10/2007 | Sneh | |
| 2007/0264488 A1 | 11/2007 | Lee | |
| 2007/0281082 A1* | 12/2007 | Mokhlesi et al. | 427/248.1 |
| 2007/0281089 A1* | 12/2007 | Heller et al. | 427/255.5 |
| 2008/0026162 A1 | 1/2008 | Dickey et al. | |
| 2008/0075881 A1 | 3/2008 | Won et al. | |
| 2008/0092953 A1 | 4/2008 | Lee | |
| 2008/0106202 A1 | 5/2008 | Du et al. | |
| 2008/0241387 A1 | 10/2008 | Keto | |
| 2008/0260963 A1 | 10/2008 | Yoon et al. | |
| 2009/0017190 A1 | 1/2009 | Sferlazzo et al. | |
| 2009/0044661 A1 | 2/2009 | Li et al. | |
| 2009/0068849 A1 | 3/2009 | Endo et al. | |
| 2009/0102385 A1 | 4/2009 | Wi | |
| 2009/0130858 A1 | 5/2009 | Levy | |
| 2009/0133714 A1 | 5/2009 | Yamazaki et al. | |
| 2009/0165715 A1 | 7/2009 | Oh | |
| 2009/0170345 A1 | 7/2009 | Akae et al. | |
| 2009/0197406 A1 | 8/2009 | Cao et al. | |
| 2009/0291211 A1* | 11/2009 | Ryu et al. | 427/255.23 |
| 2010/0037820 A1 | 2/2010 | Lee | |
| 2010/0037824 A1 | 2/2010 | Lee | |
| 2010/0055347 A1 | 3/2010 | Kato et al. | |
| 2010/0064971 A1 | 3/2010 | Lee | |
| 2010/0068413 A1 | 3/2010 | Lee | |
| 2010/0124618 A1 | 5/2010 | Kobayashi et al. | |
| 2010/0181566 A1 | 7/2010 | Lee | |
| 2010/0189900 A1* | 7/2010 | Dickey et al. | 427/255.5 |
| 2010/0215871 A1 | 8/2010 | Lee | |
| 2010/0255625 A1 | 10/2010 | De Vries | |
| 2010/0304047 A1 | 12/2010 | Yang et al. | |
| 2010/0310771 A1 | 12/2010 | Lee | |
| 2011/0070380 A1 | 3/2011 | Shero et al. | |
| 2012/0021252 A1 | 1/2012 | Lee | |
| 2012/0114877 A1 | 5/2012 | Lee | |
| 2012/0125258 A1 | 5/2012 | Lee | |
| 2012/0207948 A1 | 8/2012 | Lee | |
| 2012/0213945 A1 | 8/2012 | Lee | |
| 2012/0225204 A1* | 9/2012 | Yudovsky | 427/248.1 |
| 2012/0301632 A1 | 11/2012 | Lee | |

FOREIGN PATENT DOCUMENTS

| | | |
|---|---|---|
| EP | 0499524 A1 | 2/1992 |
| FR | 2736632 A1 | 1/1997 |
| JP | S62-081018 A | 4/1987 |
| JP | H01-096924 A | 4/1989 |
| JP | 1-161835 A | 6/1989 |
| JP | H01-223724 A | 9/1989 |
| JP | H2-187018 A | 7/1990 |
| JP | H04-092414 A | 3/1992 |
| JP | H09-064000 A | 3/1997 |
| JP | 09-167757 A | 6/1997 |
| JP | 09-199738 A | 7/1997 |
| JP | 11-092943 A | 4/1999 |
| JP | 2001-357780 A | 12/2001 |
| JP | 2002-018276 A | 1/2002 |
| JP | 2003-049272 A | 2/2003 |
| JP | 2003-073835 A | 3/2003 |
| JP | 2003-174019 A | 6/2003 |
| JP | 2003-324070 | 11/2003 |
| JP | 2004-010949 A | 1/2004 |
| JP | 2004/091837 A | 3/2004 |
| JP | 2005-089781 A | 4/2005 |
| JP | 2005-116898 | 4/2005 |
| JP | 2005-347245 A | 5/2005 |
| JP | 2006-236697 A | 9/2006 |
| JP | 2007-019460 A | 1/2007 |
| JP | 2007-191792 A | 8/2007 |
| JP | 2007-266093 A | 10/2007 |
| JP | 2008-108895 A | 5/2008 |
| KR | 100175011 B1 | 11/1998 |
| KR | 10-2001-0040561 | 5/2001 |
| KR | 10-2002-0078804 | 10/2002 |
| KR | 10-2002-0083564 A | 11/2002 |
| KR | 10-0631972 | 8/2003 |
| KR | 10-2004-0042209 A | 5/2004 |
| KR | 10-2005-0015931 A | 2/2005 |
| KR | 10-0542736 | 1/2006 |
| KR | 10-2006-0117607 | 11/2006 |
| KR | 10-0673211 B1 | 1/2007 |
| KR | 10-2007-0051332 A | 5/2007 |
| KR | 10-2007-0076955 A | 7/2007 |
| KR | 10-2007-0096770 A | 10/2007 |
| KR | 10-2007-0101127 A | 10/2007 |
| KR | 10-2007-0101360 A | 10/2007 |
| KR | 10-0771926 A | 10/2007 |
| KR | 10-2008-0067042 A | 7/2008 |
| WO | WO 2006/054854 A1 | 5/2006 |
| WO | WO 2007/134322 A2 | 11/2007 |
| WO | WO 2008/130369 A1 | 10/2008 |
| WO | WO 2009/031886 A2 | 3/2009 |
| WO | WO 2010/138102 A1 | 12/2010 |

OTHER PUBLICATIONS

PCT International Search Report and Written Opinion, PCT Application No. PCT/US12/25095, Aug. 3, 2012, 18 pages.
PCT International Search Report and Written Opinion, PCT Application No. PCT/US2011/44470, Dec. 7, 2011, 13 pages.
PCT International Search Report and Written Opinion, PCT Application No. PCT/US2011/056285, Mar. 8, 2012, 11 pages.
PCT International Search Report and Written Opinion, PCT Application No. PCT/US2011/58552, Mar. 14, 2012, 12 pages.

(56) References Cited

OTHER PUBLICATIONS

PCT International Search Report and Written Opinion, PCT Application No. PCT/US2011/060474, Mar. 22, 2012, 12 pages.
European Extended Search Report, European Application No. 10786646.9, Nov. 29, 2012, 17 pages.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.
Zhu, M. et al., "Aluminum Oxynitride Interfacial Passivation Layer for High-Permittivity Gate Dielectric Stack on Gallium Arsenide." Applied Physics Letters, 202903, 2006, pp. 1-3, vol. 89.
Gate Dielectric on Gallium Arsenide, Applied Physics Letters, 202903, 2006, pp. 1-3, vol. 89.
PCT Written Opinion, PCT Application No. PCT/KR2010/001076, Sep. 27, 2010, 8 pages.
U.S. Appl. No. 13/185,793, filed Jul. 19, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.
European Examination Report, European Patent Application No. 10786646.9, Oct. 24, 2013, 5 pages.
Taiwan Office Action, Taiwan Application No. 100126066, Oct. 8, 2013, 14 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.

\* cited by examiner

| Direction | Process | Description |
|---|---|---|
| ↑↓↑↓ . . . ↑↓ | TMA/Ar/O*/Ar/O*/Ar/<br>Ar/O*/Ar/O*/Ar/TMA/<br>TMA/Ar/O*/Ar/O*/Ar/<br>Ar/O*/Ar/O*/Ar/TMA/ | 1 ALD layer + O* anneal<br>O* anneal + O* anneal + 1 ALD layer<br>1 ALD (2TMA) layer + O* anneal<br>O* anneal + O* anneal + 1ALD layer |
| | TMA/Ar/O*/Ar/O*/Ar/<br>Ar/O*/Ar/O*/Ar/TMA/ | 1 ALD (2TMA) layer + O* anneal<br>O* anneal + O* anneal + 1ALD layer |

| Direction | Process | Description |
|---|---|---|
| ↑↓↑↓ . . . ↑↓ | TMA/Ar/O*/Ar*/ Ar*/O*/Ar/O*/Ar/TMA/ TMA/Ar/O*/Ar*/ Ar*/O*/Ar/O*/Ar/TMA/ | 1 ALD layer + O* + Ar* Ar* + 2 O* 1 ALD (2TMA) layer + O* + Ar* Ar* + 2 O* |
| | TMA/Ar/O*/Ar*/ Ar*/O*/Ar/O*/Ar/TMA/ | 1 ALD (2TMA) layer + O* + Ar* Ar* + 2 O* |

# DEPOSITION OF LAYER USING DEPOSITING APPARATUS WITH RECIPROCATING SUSCEPTOR

CROSS-REFERENCE TO RELATED APPLICATION

This application claims priority under 35 U.S.C. §119(e) to co-pending U.S. Provisional Patent Application No. 61/394,275, filed on Oct. 18, 2010, which is incorporated by reference herein in its entirety.

BACKGROUND

1. Field of Art

The present invention relates to depositing one or more layers of materials on a substrate using atomic layer deposition (ALD).

2. Description of the Related Art

An atomic layer deposition (ALD) is a thin film deposition technique for depositing one or more layers of material on a substrate. ALD uses two types of chemical, one is a source precursor and the other is a reactant precursor. Generally, ALD includes four stages: (i) injection of a source precursor, (ii) removal of a physical adsorption layer of the source precursor, (iii) injection of a reactant precursor, and (iv) removal of a physical adsorption layer of the reactant precursor. ALD can be a slow process that can take an extended amount of time or many repetitions before a layer of desired thickness can be obtained. Hence, to expedite the process, a vapor deposition reactor with a unit module (so-called a linear injector), as described in U.S. Patent Application Publication No. 2009/0165715 or other similar devices may be used to expedite ALD process. The unit module includes an injection unit and an exhaust unit for a source material (a source module), and an injection unit and an exhaust unit for a reactant (a reactant module).

A conventional ALD vapor deposition chamber has one or more sets of reactors for depositing ALD layers on substrates. As the substrate passes below the reactors, the substrate is exposed to the source precursor, a purge gas and the reactant precursor. The source precursor molecules deposited on the substrate reacts with reactant precursor molecules or the source precursor molecules are replaced with the reactant precursor molecules to deposit a layer of material on the substrate. After exposing the substrate to the source precursor or the reactant precursor, the substrate may be exposed to the purge gas to remove excess source precursor molecules or reactant precursor molecules from the substrate.

SUMMARY

Embodiments relate to depositing one or more layers of materials on a substrate by causing relative movements between the substrate and reactors in two opposite directions. The reactors inject gases or radicals onto the substrate as the substrate passes the reactors. When the substrate and the reactors make a relative movement in a first direction, at least one atomic layer is deposited on the substrate by injection of at least a precursor gas and a reactant gas on the substrate. When the substrate and the reactors make a relative movement in a second direction opposite to the first direction, annealing of the surface of the substrate is performed by the reactors.

In one embodiment, the relative movements of the susceptor and the reactors in the first direction and in the second direction are repeated for a predetermined number of times. In this way, a layer of desired thickness may be obtained.

In one embodiment, radicals of inert gas are injected onto the substrate to treat the surface of the substrate. The source precursor is injected onto the substrate after injecting the radicals of the inert gas onto the substrate. Exposing the surface of the substrate to the radicals of inert gas increases the absorption rate of the source precursor molecules on the surface of the substrate, advantageously leading to increased deposition rate of the layer. The inert gas may comprise Argon gas.

In one embodiment, the precursor gas includes Trimethylaluminium. The reactant gas includes oxygen radicals. The deposited layer is $Al_2O_3$.

BRIEF DESCRIPTION OF DRAWINGS

FIGS. 6A through 9B are diagrams and tables illustrating processes performed by various reactor units on a substrate, according to various embodiments.

DETAILED DESCRIPTION OF EMBODIMENTS

Figure 1:
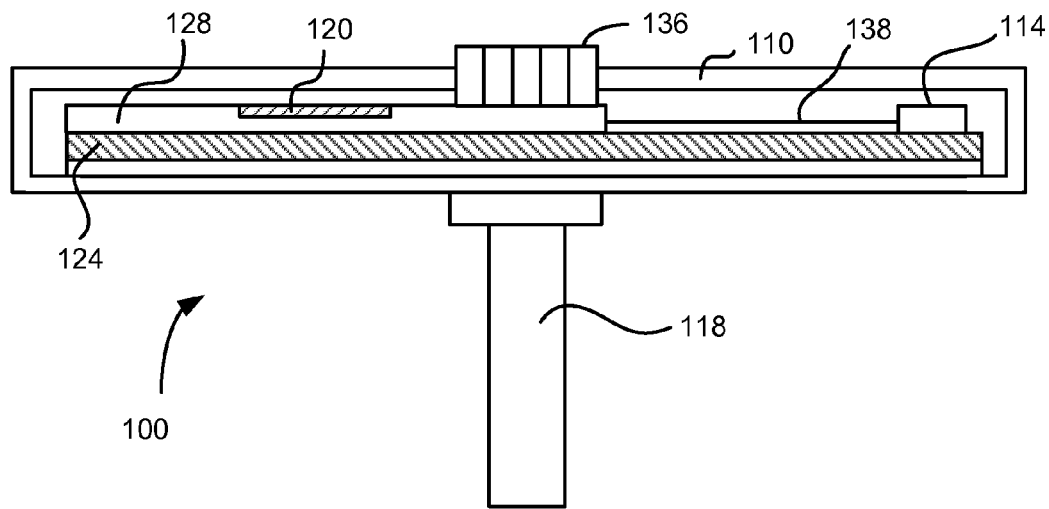
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to performing atomic layer deposition by reciprocating a susceptor in two opposite directions, subjecting a substrate on the susceptor to two different sequences of processes. As the substrate moves in a direction, the substrate is injected with a series or gases and/or radicals by reactors. The reciprocation of the substrate in both directions subjects the substrate to two different sequences of processes. By subjecting the susceptor to two different sequences of processes, the substrate may be subject to one or more processes that otherwise would require an additional set of reactors. The reduced number of reactors enables a more compact deposition device, and reduction of the cost associated with the deposition device.

Figure 2:
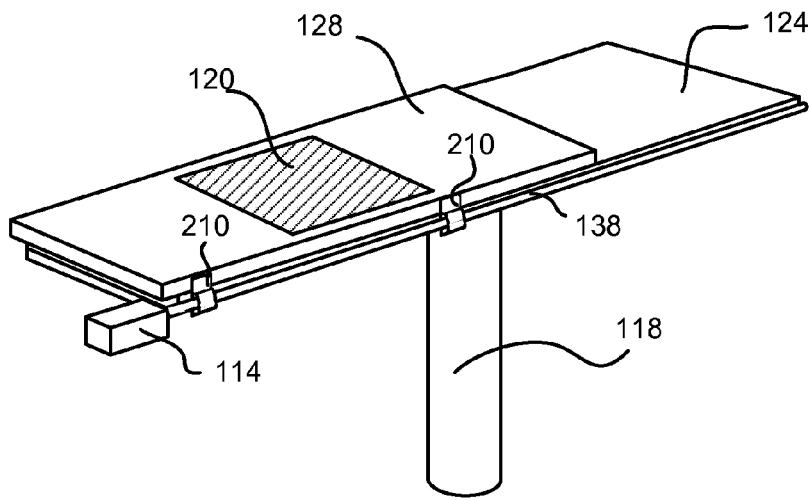
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls 110 to facilitate explanation), according to one embodiment. The linear deposition device 100 may include, among other components, a support pillar 118, the process chamber 110 and one or more reactors 136. The reactors 136 may include one or more of injectors and radical reactors.

Each of the injector modules injects source precursors, reactant precursors, purge gases or a combination of these materials onto the substrate 120.

Figure 4A:
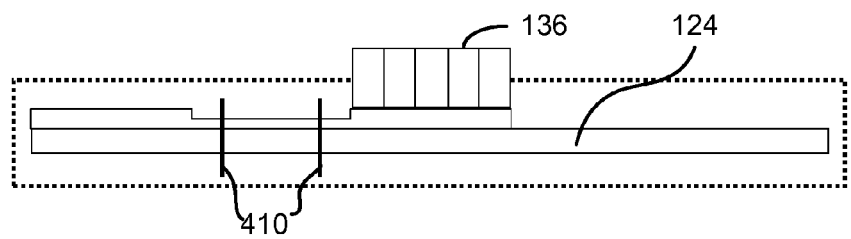
FIGS. 4A through 4G are conceptual diagrams illustrating the sequence of processes for depositing one or more layers of material on a substrate, according to one embodiment.
Figure 4B:
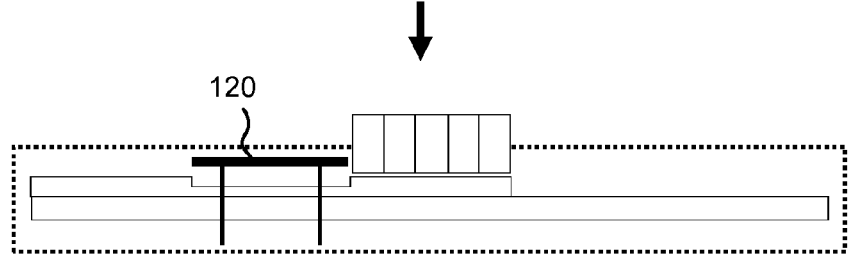
Figure 4C:
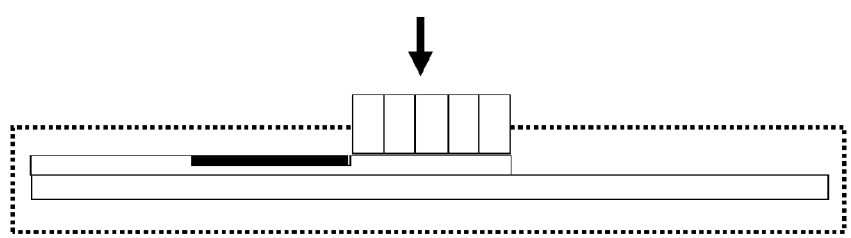

The process chamber enclosed by the walls 110 may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins (see FIGS. 4A, 4B and 4F below) that facilitate loading of the substrate 120 onto the susceptor 128 or dismounting of the substrate 120 from the susceptor 128.

In one embodiment, the susceptor 128 is secured to brackets 210 that moves across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and direction of the linear movement of the susceptor 128 can be controlled. The use of a motor 114 and the extended bar 138 is merely an example of a mechanism for moving the susceptor 128. Various other ways of moving the susceptor 128 (e.g., use of gears and pinion at the bottom, top or side of the susceptor 128). Moreover, instead of moving the susceptor 128, the susceptor 128 may remain stationary and the reactors 136 may be moved.

Figure 3A:
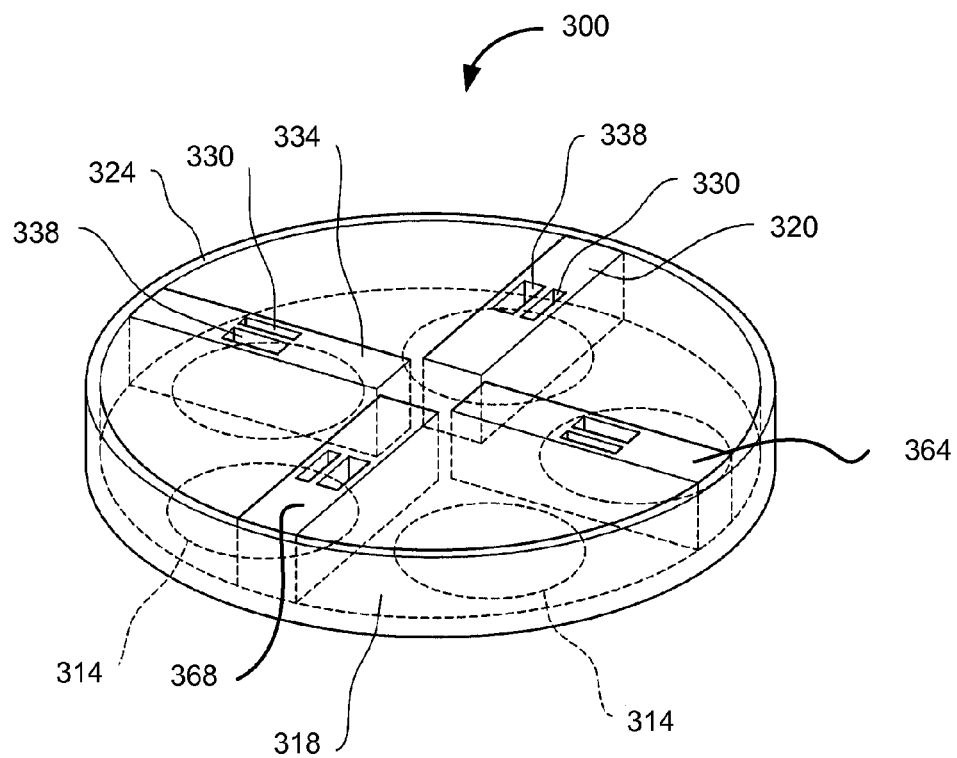
FIG. 3A is a perspective view of a rotating deposition device, according to one embodiment.

FIG. 3A is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. The susceptor 318 secures the substrates 314 in place. The reactors 320, 334, 364, 368 are placed above the substrates 314 and the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338.

Embodiments as described herein may be use in the linear deposition device 100, the rotating deposition device 300 or other types of deposition device. Taking the examples of the linear deposition device 100 and the rotating deposition device 300, the substrate 120 (or 314) may undergo different sequences of processes by moving the substrate 120 (or 314) relative to the reactors in one direction and then in an opposite direction.

Figure 3B:
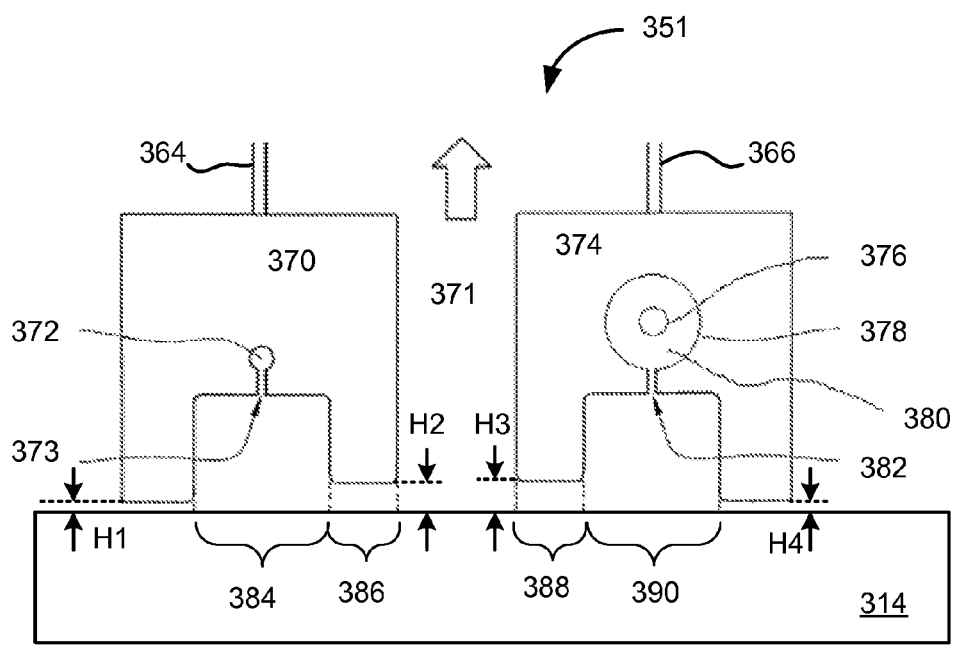
FIG. 3B is a diagram illustrating a reactor according to one embodiment.

FIG. 3B is a diagram illustrating a reactor 351 according to one embodiment. The reactor 351 may be used in the linear deposition device 100 or the rotating deposition device 300. The reactor 351 may include, among other components, an injector 370 and a radical reactor 374. As illustrated, the injector 370 is raised above the substrate 314 by height H1, and the radical reactor 374 is raised above the substrate 314 by height H2 to provide sufficient clearance for the substrate 314 to pass below the injector 370 and the radical reactor 374.

The injector 374 receives gas via a pipe 364 and injects the gas into its chamber 384 via a channel 372 and holes 373 formed in the injector 370. The gas injected via the injector 374 may be a source precursor, a reactant precursor, a purge gas or gases for any other purpose. Within the chamber 384, the gas then comes into contact with the substrate 314 and performs the function as precursors or purge gas. The remaining gas is ejected via a constriction zone 386 (having height of H2) to an outlet 371. In the constriction zone 386, the speed of the gas flow is increased, facilitating removal of redundant gas from the surface of the substrate 314.

The radical reactor 374 receives gas via pipe 366. The gas is injected into a cavity 380 between an inner electrode 376 and an outer electrode 378. Voltage is applied across the inner electrode 376 and the outer electrode 378 so that when the gas is injected into the cavity 380, plasma of the gas generates radicals in the cavity 380. The radicals of the gas are then injected into a chamber 390 where the radicals come in contact with the substrate 314. Radicals reverted to inactive state as well as some redundant radicals pass through a constriction zone 388 (having height of H3) and are discharged via the outlet 371.

The reactors of FIG. 3B is illustrative. Various other types of reactors may be used in the linear deposition device 100 or rotating deposition device 300. In alternative embodiments, the reactors may include only injectors, only radical reactors, more than two injectors and radical reactors or radical reactors/injectors in a different sequence.

FIGS. 4A through 4G are conceptual diagrams illustrating the sequence of processes for depositing one or more layers of material on a substrate 124, according to one embodiment. First, lift pins 410 are raised to receive a substrate 120 (see FIG. 4A). Subsequently, the substrate 120 is loaded onto the susceptor 124 by placing the substrate 120 on the lifting pin 410 (see FIG. 4B) and then lowering the lifting pin 410 (see FIG. 4C).

Figure 4D:
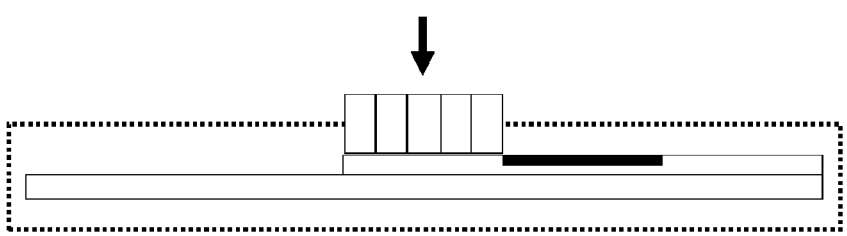
Figure 4E:
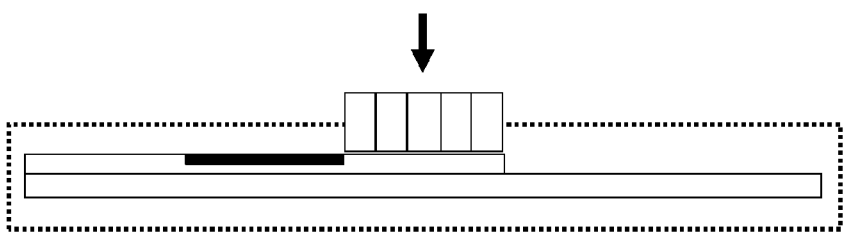
Figure 4F:
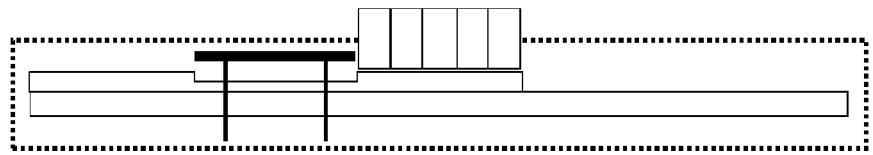

Then the susceptor 120 is moved across the reactors 130 to subject the substrate 120 to a first sequence of processes (see FIG. 4D). The moving direction of the susceptor is then switched, and the susceptor moves in the opposite direction to subject the substrate 120 to a second sequence of processes (see FIG. 4E). The second sequence of processes is a reversed sequence of the first sequence of processes. Depending on the thickness of the deposited layer or desired characteristics of the deposited layer, the first and second sequences of processes may be repeated for a predetermined number of times.

Figure 4G:
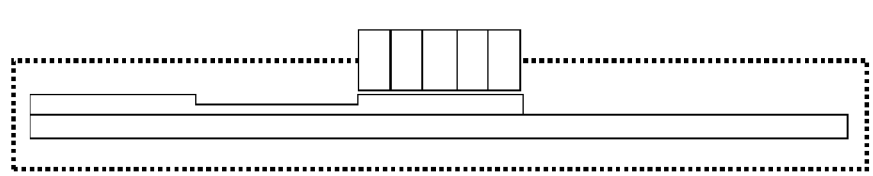

After the predetermined number of the first and second sequences is repeated, the substrate 120 is lifted from the susceptor by the lift pins 410 (see FIG. 4F) and removed from the susceptor (see FIG. 4G).

Figure 5:
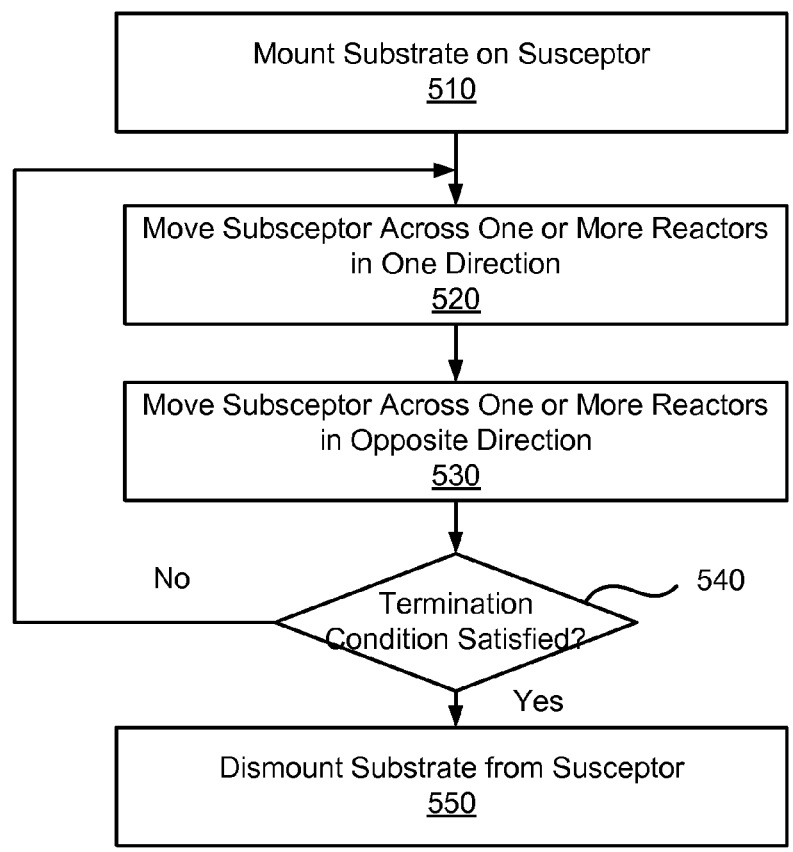
FIG. 5 is a flowchart illustrating a process of depositing one or more layers on a substrate, according to one embodiment.

FIG. 5 is a flowchart illustrating a process of depositing one or more layers of material on a substrate, according to one embodiment. First, the substrate is mounted 510 on the susceptor. The susceptor (with the substrate) is moved 520 across one or more reactors in one direction to subject the substrate to a first sequence of processes. Then the susceptor is moved 530 across the same set of reactors in an opposite direction to subject the substrate to a second sequence of processes. The reactors may inject the same gas and/or radicals when the susceptor moves in both directions but in different sequences.

It is then determined 540 if the condition for terminating the processes is satisfied (e.g., a predetermined thickness of layer reached or a predetermined number of processes repeated). If the termination condition has not been satisfied, the process returns to moving 520 the susceptor in one direction and repeats the subsequent processes. If the termination condition has been satisfied, the process proceeds to dismounting 550 the substrate from the susceptor.

Examples of processing a substrate by different processes are described herein with reference to FIGS. 6A through 9B. The depositing device of FIG. 6A includes a first unit 602 and a second unit 614 for depositing a layer of $Al_2O_3$ on a substrate 620. The first unit 602 includes three injection modules 614, 622, 634 and a radical reactor 626. The injector module 614 injects TMA (Trimethylaluminium), and the injector modules 622, 634 inject Argon gas. The radical reactor 626 generates radicals of oxygen (O*) and injects the radicals onto the substrate 620. Any redundant gas or plasma in the first unit 602 is discharged via outlets 618 and 630. The second unit 614 has the same structure as the first unit 614. That is, the second unit 614 includes three injection modules 638, 648, 660 and a radical reactor 652. The injector module 638 injects TMA, and the injector modules 648, 660 inject Ar gas. Any redundant gas or plasma in the second unit 614 is discharged via outlets 644 and 656.

Figures 6A, 6B:
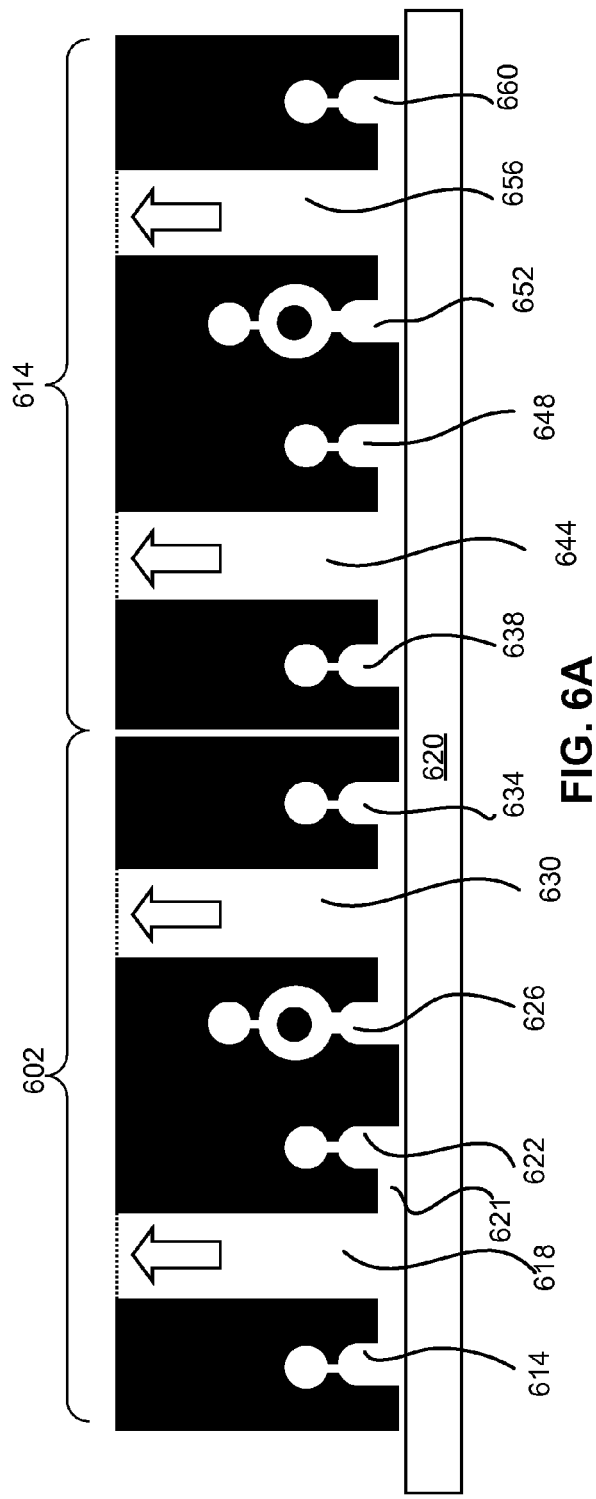

In the embodiment of FIG. 6A, a substrate 620 moves from the left to the right (in a first direction), and then from the right to the left (in a second direction). The materials which the substrate 620 is exposed to and the sequence of processes are illustrated in FIG. 6B. When moving below the first unit 602 in the first direction, the substrate 620 is exposed to TMA (as a source precursor) followed by Ar gas (as a purge gas, to remove physisorbed redundant TMA). After being injected, the Ar gas passes through a constricted zone 621. While passing the constricted zone 621, the speed of Ar gas flow is increased. The increased flow speed of Ar gas contributes to effective removal of excess TMA (physisorbed TMA) from the surface of the substrate 620.

Then the substrate 620 is exposed to O* (as a reactant precursor). The reaction between the TMA and O* results in a layer of $Al_2O_3$. The subsequently injected Ar gas removes any redundant gas from the surface of the substrate 620. Since the first unit 602 and the 614 have the same structure and inject the same gases or radicals, the substrate 620 undergoes the same process twice as the substrate 620 passes below the first unit 602 and second unit 614.

When the substrate 620 moves in the second direction, the substrate 620 is first exposed to argon gas (by the injector 660) and then to radical O* (by the radical reactor 652). The exposure to O* causes annealing of the substrate 620. The substrate 620 is then subject to Ar gas (by the injector 648) and then TMA (by the injector 638). The substrate 620 is then injected with Ar gas (by the injector 634) and then O* (by the radical reactor 626). The exposure of the substrate 620 to the TMA (by the injector 638) and the subsequent exposure to O* (by the radical reactor 626) forms an $Al_2O_3$ layer on the substrate 620 (shown as dashed boxes in FIG. 6B). Consequently, moving the substrate 620 in the second direction (from the right to the left) causes the substrate 620 to undergo annealing by O* (generated by the radical reactor 652) followed by deposition with a layer of $Al_2O_3$. As the last step of moving the substrate 620 in the second direction, the substrate 620 is exposed to TMA by the injector 614.

The substrate 620 is then moved again in the first direction. When moving again in the first direction, the substrate 620 is exposed to TMA again by the injector 614. However, this additional exposure to TMA may advantageously ensure that the surface is absorbed with TMA. Further, purging of redundant TMA (by the injector 622) removes the excess TMA, and hence, exposing the substrate 620 to TMA twice does not negatively affect the quality of the $Al_2O_3$ layer formed on the substrate 620.

The substrate 620 may be reciprocated for a predetermined number of times in both the first direction and the second direction to obtain an $Al_2O_3$ layer of a desired thickness.

Note that moving the substrate 620 in the second direction causes the substrate 620 to advantageously undergo annealing. If the substrate 620 is moved only in the first direction, the substrate 620 would not undergo any annealing process. Rather, two layers of $Al_2O_3$ are formed on the substrate 620. By moving the substrate 620 in the second direction, the substrate 620 can be surface treated without providing any additional reactors. Hence, the characteristics of the deposited $Al_2O_3$ layer can be enhanced without the attendant cost associated with providing an additional radical reactor.

Figures 7A, 7B:
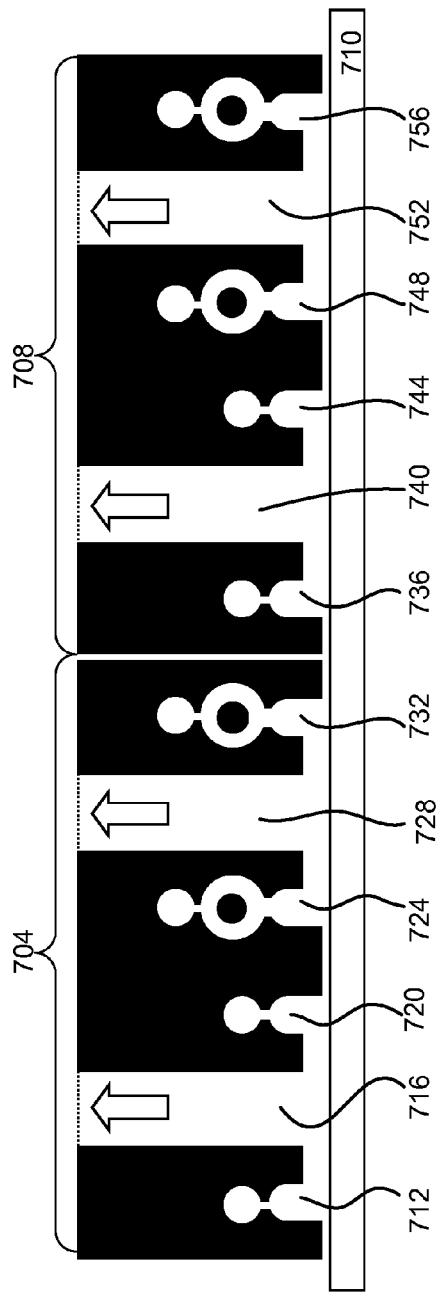

The depositing device of FIG. 7A includes a first unit 704 and a second unit 708 for depositing a layer of $Al_2O_3$ on a substrate 710, according to one embodiment. The first unit 704 includes two injection modules 712, 720 and two radical reactors 724, 732. The injector module 712 injects TMA, and the injector module 720 injects Ar gas. The radical reactor 724 generates O* and injects the radicals onto the substrate 710. The radical reactor 732 generates Argon radicals (Ar*) and injects them onto the substrate 710. Any redundant gases or radicals in the first unit 704 are discharged via outlets 716 and 728. The second unit 708 has the same structure as the first unit 704. That is, the second unit 708 includes two injection modules 736, 744 and two radical reactors 748, 756. The injector modules 748, 756 inject O* radicals and Ar* radicals, respectively, onto the surface of the substrate 710. Any redundant gases or radicals in the second unit 708 are discharged via outlets 740 and 752.

In the embodiment of FIG. 7A, the substrate 710 moves from the left to the right (in a first direction), and then from right to left (in a second direction). The materials which the substrate 710 is exposed to and their sequence of processes are illustrated in FIG. 7B. When moving below the first unit 704 in the first direction, the substrate 710 is exposed to TMA (as a source precursor) followed by Ar gas (as a purge gas to remove redundant TMA) by the injector 720. Then the substrate 710 is exposed to O* (as a reactant precursor) by the radical reactor 724. The reaction between the TMA and O* results in a layer of $Al_2O_3$. The subsequent Ar* treats the surface of the substrate 710 into a state more amenable for absorbing the source precursor when passing below the second unit 708. The exposure of the $Al_2O_3$ layer to Ar* radical is advantageous because the surface of the layer comes to attract more TMA molecules in a subsequent process. The exposure to Ar* radicals leads to approximately three times the thickness of $Al_2O_3$ layer compared to the case where the substrate 710 is not exposed to Ar* radicals ("3 ALD" shown in dashed ellipse in FIG. 7B indicates that the thickness of the ALD layer formed is approximately three times compared to an ALD layer formed when not previously exposed to Ar*).

After exposure to Ar* (by the radical reactor 732), the substrate 710 is again injected with TMA (by the injector 736), Argon gas (by the injector 744), O* radicals (by the radical reactor 748) and Ar* radicals (by the radical reactor 756).

When the substrate 710 moves in the second direction, the substrate 710 is first exposed to Ar* radicals (by the radical reactor 756) and then to O* radicals (by the radical reactor 748). The exposure to O* radicals causes annealing of the substrate 710. The substrate 710 is then subject to Ar gas (by the injector 744) and then TMA (by the injector 736). The substrate 710 is then injected with Ar plasma (by the radical reactor 732) and then O* radicals (by the radical reactor 724). The exposure of the substrate 710 to the TMA (by the injector 736) and the subsequent exposure to O* (by the radical reactor 732) forms an Al$_2$O$_3$ layer on the substrate 710 (shown as dashed boxes in FIG. 7B). Consequently, moving the substrate 710 in the second direction (from the right to the left) causes the substrate 710 to undergo annealing by O* (generated by the radical reactor 748) followed by the deposition of a layer of Al$_2$O$_3$. As the last step of moving the substrate 710 in the second direction, the substrate 710 is exposed to TMA by the injector 712.

The substrate 710 is then moved again in the first direction. When moving again in the first direction, the substrate 710 may be exposed to TMA again by the injector 712. However, this additional exposure to TMA may advantageously ensure that the surface is sufficiently absorbed with TMA. Further, purging of redundant TMA (by the injector 720) removes the excess TMA, and hence, exposing the substrate 710 to TMA twice does not negatively affect the quality of the Al$_2$O$_3$ layer to be formed on the substrate 710 by exposure to O*.

Similar to the embodiment of FIG. 6A, the embodiment of FIG. 7A advantageously undergo annealing by O* as well as experience increased deposition speed due to exposure to Ar* without requiring additional reactors.

In other embodiments, an increased number of units may be added. For example, instead of using the same two units of depositing modules as in the embodiment of FIGS. 6A and 7A, three or more units of depositing modules may be placed in tandem to increase the deposition rate per reciprocation of the substrate.

Figures 8A, 8B:
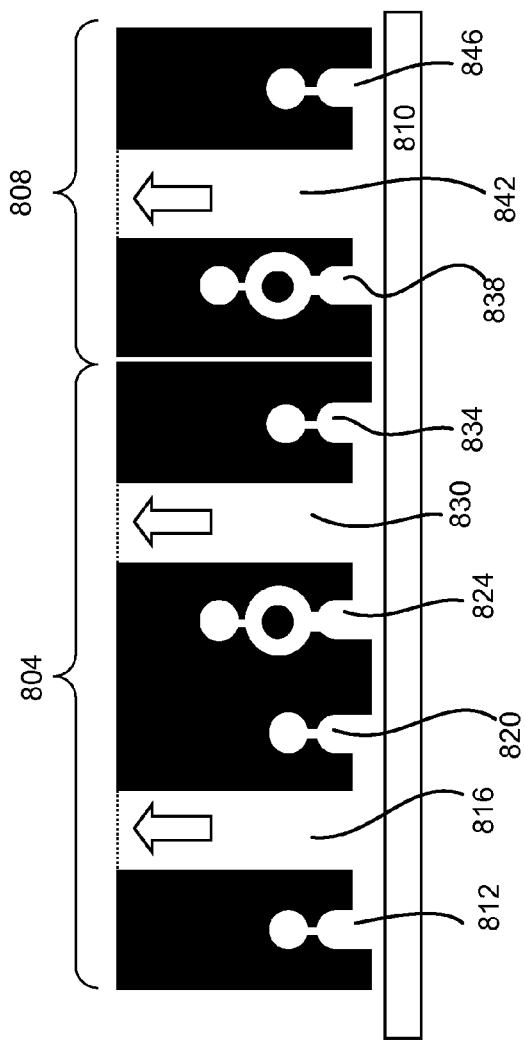

Although embodiment of FIGS. 6A and 7A uses units of modules with the same configuration, each unit of modules may have a different configuration in other embodiments. FIG. 8A is a diagram illustrating reactors with a first unit 804 and a second unit 808 of different configurations. The first unit 804 includes three injectors 812, 820, 834 and a radical reactor 824 for depositing an Al$_2$O$_3$ layer. The injectors 812, 820, 834 inject TMA, Ar gas and Ar gas, respectively, onto the substrate 810. Outlets 816 and 830 are provided to discharge excess gases or radicals from the first unit 804. The second unit 808 includes a radical reactor 838 and an injector 846 for annealing the substrate 810. The second unit 808 also includes an outlet 842 for discharging excess gases or radicals from the second unit 808.

When the substrate 810 moves in the first direction (from the left to the right) below the first unit 804, the substrate undergoes the same series of processes as described above with reference to the first unit 602 of FIG. 6A. Hence, the description of the processes associated with the first unit 804 is omitted herein for the sake of brevity. After passing below the first unit 804, the substrate 810 moves below the second unit 808. When the substrate 810 passes below the second unit 808, the radical reactor 838 injects O* onto the surface of the substrate 810, which anneals the surface of the substrate 810. Then Ar gas is injected onto the substrate 810 by the injector 846 to remove redundant materials from the surface of the substrate 810.

When the substrate 810 moves in the second direction (from the right to the left), the surface 810 is first injected with Ar gas by the injector 846 followed by injection of O* by the radical reactor 838. The subsequent processes in the first unit 804 is the same as the processes in the first unit 602 of FIG. 6A, and hence, the description of the process associated with the first unit 804 is omitted herein for the sake of brevity. FIG. 8B summarizes the processes performed on the substrate 810 by the first unit 804 and the second unit 808.

Note that the substrate 810 is surface treated by O* twice when moving in the second direction. Hence, the substrate 810 is surface treated three times (once when moving in the first direction and twice when moving in the second direction) during one cycle of reciprocation. The two additional times of surface treatment are accomplished without adding any injectors or radical reactors, which reduces the cost and complexity associated with added components.

Figures 9A, 9B:
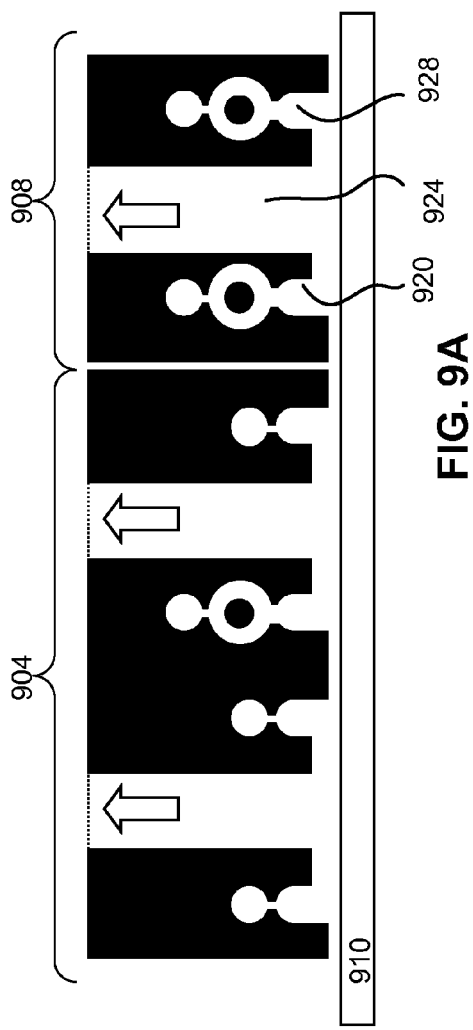

FIG. 9A is an arrangement of reactors according to another embodiment. In this embodiment, two units of reactors are provided: the first unit 904 and the second unit 908. The first unit 904 is essentially the same as the first unit of FIG. 6A, and hence, the detailed description thereof is omitted for the sake of brevity. The second unit 908 includes two radical reactors 920 and 928. The radical reactor 920 injects O* radicals onto the substrate 910. The radical reactor 928 injects Ar* radicals onto the substrate 910. An outlet 924 for discharging redundant gases or radicals is provided between the two radical reactors 920, 928. FIG. 8B summarizes materials injected onto the substrate 910 and the processes performed on the substrate 910. Note that a single ALD layer is formed on the substrate 910 and annealing is performed five times per one cycle of reciprocation.

Although above embodiments described with reference to FIGS. 6A through 9B are associated with depositing Al$_2$O$_3$ layers on the substrate, the same principle can be applied to deposition of different materials on the substrate. To change the materials deposited, the source precursor and the reactant precursor may be changed.

The substrate fabricated using such methods can be used in various applications such as display devices or other electronic devices. Depending on the applications, various types of substrate may also be used. Example substrates include silicon wafers and glasses.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of depositing a layer on a substrate, comprising:

causing relative linear movement between an entire substrate and one or more reactors in a first direction, at least one atomic layer deposited on the entire substrate during the relative movement in the first direction by injecting at least a precursor gas and a reactant gas on the entire substrate; and after causing the relative linear movement between the entire substrate and the one or more reactors in the first direction, causing relative linear movement between the entire substrate and the one or more reactors in a second direction opposite to the first direction;

wherein annealing is performed during the relative linear movement between the one or more reactors in the second direction.

2. The method of claim 1, further comprising repeating the relative linear movements in the first direction and in the second direction for a predetermined number of times.

3. The method of claim 2, further comprising:

mounting the entire substrate onto a susceptor before causing the relative linear movement; and dismounting the substrate from the susceptor after repeating the relative linear movements for the predetermined number of times.

4. The method of claim 1, further comprising injecting radicals of inert gas onto the entire substrate.

5. The method of claim 4, further comprising injecting a source precursor onto the entire substrate after injecting the radicals of the inert gas onto the entire substrate.

6. The method of claim 4, wherein the inert gas comprises Argon gas.

7. The method of claim 1, wherein the precursor gas comprises Trimethylaluminium, the reactant gas comprises oxygen radicals and the layer comprises $Al_2O_3$.

8. The method of claim 1, wherein the relative linear movements of the entire substrate are in a plane that contains a deposition surface of the entire substrate.

* * * * *